United States Patent
Huang et al.

(10) Patent No.: US 11,682,438 B1
(45) Date of Patent: Jun. 20, 2023

(54) DATA WRITING CONTROL DEVICE AND DATA WRITING CONTROL METHOD THEREOF

(71) Applicant: NANYA TECHNOLOGY CORPORATION, New Taipei (TW)

(72) Inventors: Tien Te Huang, New Taipei (TW); Yu Hsin Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/671,618

(22) Filed: Feb. 15, 2022

(51) Int. Cl.
  *G11C 7/22* (2006.01)
  *G11C 8/18* (2006.01)
  *G11C 7/10* (2006.01)

(52) U.S. Cl.
  CPC .......... *G11C 7/222* (2013.01); *G11C 7/1012* (2013.01); *G11C 7/1039* (2013.01); *G11C 8/18* (2013.01)

(58) Field of Classification Search
  CPC .................. G11C 7/222; G11C 7/22
  USPC ........................................ 365/233.1
  See application file for complete search history.

(56) References Cited

U.S. PATENT DOCUMENTS

| | | | |
|---|---|---|---|
| 8,031,553 B2 * | 10/2011 | Byun | G11C 7/1066 365/233.1 |
| 8,477,543 B2 | 7/2013 | Kwon | |
| 9,542,983 B1 | 1/2017 | Kim et al. | |
| 2011/0047319 A1 * | 2/2011 | Jeon | G06F 13/4243 711/E12.001 |
| 2012/0218834 A1 | 8/2012 | Kim | |
| 2014/0258607 A1 * | 9/2014 | Shim | G11C 7/1072 711/105 |
| 2015/0340072 A1 * | 11/2015 | Mazumder | G11C 7/1066 365/189.05 |

OTHER PUBLICATIONS

"Office Action of Taiwan Counterpart Application", dated Mar. 27, 2023, p. 1-p. 4.

* cited by examiner

*Primary Examiner* — Muna A Techane
(74) *Attorney, Agent, or Firm* — JCIPRNET

(57) ABSTRACT

A data writing control device includes a control signal generator, a data strobe enable signal generator and a data strobe index generator. The control signal generator receives a write command, a preamble setting value and a latency setting value, and generates an internal write pulse and preamble information according to the write command, the preamble setting value and the latency setting value. The data strobe enable signal generator is coupled to the control signal generator and generates a data strobe pipeline enable signal according to the internal write pulse and the preamble setting value. The data strobe index generator is coupled to the data strobe enable signal generator, and generates a plurality of data strobe indexes according to the data strobe pipeline enable signal and the preamble information.

12 Claims, 10 Drawing Sheets

DATA WRITING CONTROL DEVICE AND DATA WRITING CONTROL METHOD THEREOF

BACKGROUND OF THE INVENTION

Field of Invention

The present invention generally relates to a data writing control device and a data writing control method thereof, and more particularly to the data writing control device and a data writing control method thereof which can meet a timing requirement of specification of a dynamic random access memory (DRAM).

Description of Prior Art

In a specification of DDR5 type DRAM, a maximum value of tDQSS (A time difference of a data strobe signal relative to a clock signal) +tDQSD (A time delay between the clock signal and the data strobe signal) reached plus or minus 1.25 period of the clock signal, which caused the internal write pulse of the old architecture to fail to find the start position of the write enable correctly. Furthermore, a range of tDQSS defined in a specification of DDR4 type DRAM is only plus or minus 0.27 period of the clock signal, which is less than the period of the clock signal. So only one corresponding edge of the data strobe signal is included in the range of an internal write pulse. The conventional architecture does not cause latch jump or miss latch in DDR4. Moreover, the conventional architecture of DDR5 may include more than two edges of the data strobe signal in the internal write pulse range at the same time, and resulting in inability to operate correctly.

SUMMARY OF THE INVENTION

The present invention provides a data writing control device and a data writing control method thereof which can meet timing requirement of specification of a memory.

The data writing control device includes a control signal generator, a data strobe enable signal generator and a data strobe index generator. The control signal generator receives a write command, a preamble setting value and a latency setting value, and generates an internal write pulse and preamble information according to the write command, the preamble setting value and the latency setting value. The data strobe enable signal generator is coupled to the control signal generator and generates a data strobe pipeline enable signal according to the internal write pulse and the preamble setting value. The data strobe index generator is coupled to the data strobe enable signal generator, and generates a plurality of data strobe indexes according to the data strobe pipeline enable signal and the preamble information.

The data writing control method includes: receiving a write command, a preamble setting value and a latency setting value, and generating an internal write pulse and preamble information according to the write command, the preamble setting value and the latency setting value; generating a data strobe pipeline enable signal according to the internal write pulse and the preamble setting value; and generating a plurality of data strobe indexes according to the data strobe pipeline enable signal and the preamble information.

Accordingly, present disclosure provides the control signal generator to generate the preamble information according to the write command, the preamble setting value and the latency setting value. The control signal generator can generate the preamble information according to whether a current write command corresponding to a complete preamble or not and a data depth of writing data. The data strobe index generator can generate the data strobe indexes according to the preamble information. Such as that, and the write command can be successfully executed correspondingly.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
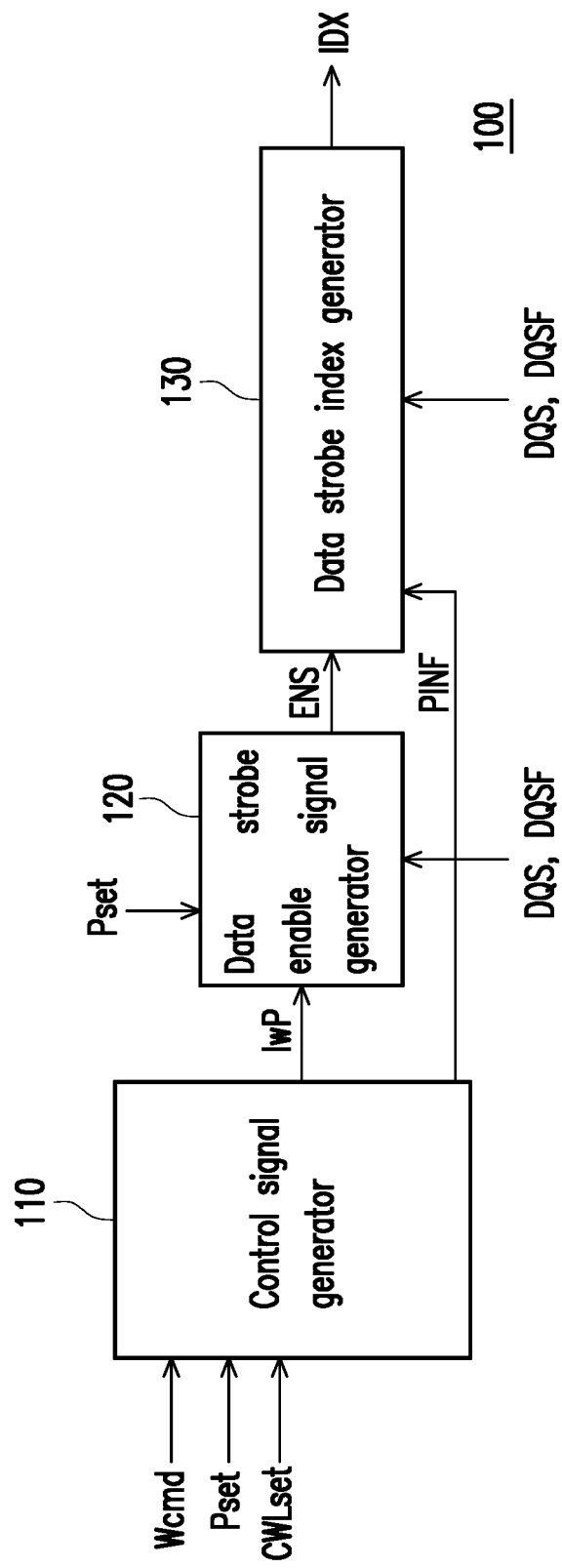
FIG. 1 illustrates a block diagram of a data writing control device according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a block diagram of a data writing control device according to an embodiment of present disclosure. The data writing control device 100 is adapted for a memory device. The data writing control device 100 includes a control signal generator 110, a data strobe enable signal generator 120 and a data strobe index generator 130. The control signal generator 110 receives a write command Wcmd, a preamble setting value Pset and a latency setting value CLset. The control signal generator 110 generates an internal write pulse IWP and preamble information PINF according to the write command Wcmd, the preamble setting value Pset and the latency setting value CWLset. The data strobe enable signal generator 120 is coupled to the control signal generator 110. The data strobe enable signal generator 120 receives the internal write pulse IWP and the preamble setting value Pset, and generates a data strobe pipeline enable signal ENS according to the internal write pulse IWP and the preamble setting value Pset. The data strobe index generator 130 is coupled to the data strobe enable signal generator 120. The data strobe index generator 130 receives the data strobe pipeline enable signal ENS and the preamble information PINF. The data strobe index generator 130 generates a plurality of data strobe indexes IDX according to the data strobe pipeline enable signal ENS and the preamble information PINF.

In detail, the control signal generator 110 receives the write command Wcmd to activate a data writing operation to the memory device. The control signal generator 110 also receives the preamble setting value Pset, where the preamble setting value Pset is used to set a time width of a preamble of writing data. The time width of the preamble can be set to N times a period of a clock signal, where N is a positive integer, and the memory device is operated based on the clock signal. The latency setting value CWLset is used to set a CAS writing latency (CWL) of the data writing operation. The CWL is a delay, in clock cycles of the clock signal, between an internal write command and an availability of a first bit of the writing data. Such as that, the control signal generator 110 can generate the internal write pulse IWP according to the write command Wcmd, the preamble setting value Pset and the latency setting value CWLset.

Furthermore, the control signal generator 110 can generate the preamble information PINF according to whether a current write command corresponding to a complete preamble or not and a data depth of the writing data. In this embodiment, the preamble information PINF may includes a plurality of bits, and a first bit of the preamble information PINF is used to record whether the current write command corresponding to a complete preamble or not and other bits of the preamble information PINF may be used to record the data depth of the writing data. If the current write command corresponding to a complete preamble, the first bit of the preamble information PINF may be at a first logic value, and if the current write command corresponding to an incomplete preamble, the first bit of the preamble information PINF may be at a second logic value, where the first logic value is different from the second logic value. In here, the first bit of the preamble information PINF may be a full preamble flag and the other bits of the preamble information PINF may be a preamble toggle signal.

The data strobe enable signal generator 120 generated the data strobe pipeline enable signal ENS in response to the internal write pulse IWP according to the preamble setting value Pset. In this embodiment, the data strobe enable signal generator 120 also receives a data strobe signal DQS and an inverted data strobe signal DQSF. The data strobe enable signal generator 120 may be triggered by one or both of the data strobe signal DQS and the inverted data strobe signal DQSF. In here, the data strobe pipeline enable signal ENS is used to indicate a data strobe pipeline operation in activated.

The data strobe index generator 130 receives the data strobe pipeline enable signal ENS the preamble setting value PINF, the data strobe signal DQS and the inverted data strobe signal DQSF. The data strobe index generator 130 can determine a start time point of the data strobe indexes IDX according to whether the current write command corresponding to the complete preamble or not and the data depth of the writing data. The data strobe index generator 130 can be triggered according one of both of the data strobe signal DQS and the inverted data strobe signal DQSF.

Figure 2:
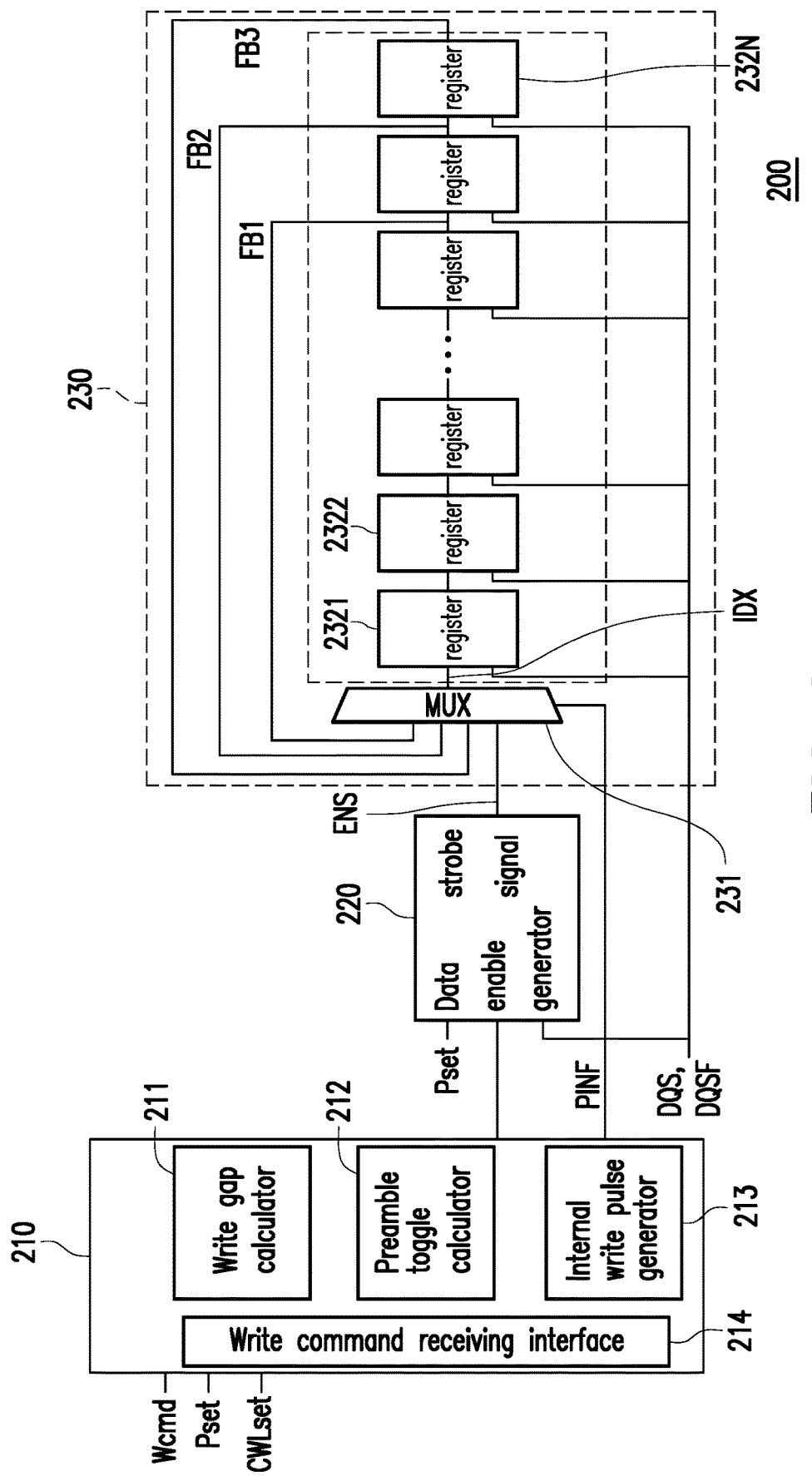
FIG. 2 illustrates a schematic diagram of a data writing control device according to another embodiment of present disclosure.

Please refer to FIG. 2, which illustrates a schematic diagram of a data writing control device according to another embodiment of present disclosure. The data writing control device 200 is adapted for a memory device. The data writing control device 200 includes a control signal generator 210, a data strobe enable signal generator 220 and a data strobe index generator 230. The control signal generator 210 includes a write gap calculator 211, a preamble toggle calculator 212, an internal write pulse generator 213 and a write command receiving interface 214. In this embodiment, the write gap calculator 211 is used to calculate a start time point of the current write command according a gap and a start time point of a previous write command when the current write command corresponds to an incomplete preamble. The preamble toggle calculator 212 generates the preamble information PINF according to whether the current write command corresponding to a complete preamble or not and a data depth of writing data. The internal write pulse generator 213 is used to generate the internal write pulse IWP according the write command Wcmd, the preamble information Pset and the latency setting value CWset.

On the other hand, the data strobe index generator 230 includes a multiplexer 231 and a plurality of registers 2321-232N. The multiplexer 231 has a plurality of input ends. One of the input ends is coupled to an output end of the data strobe enable signal generator 220 to receive a data strobe pipeline enable signal ENS. Other input ends of the multiplexer 231 are respectively coupled to some of the registers to receive a plurality of feedback signals FB1-FB3. The multiplexer 231 is controlled by the preamble information PINF. The multiplexer 231 selects one of the data strobe pipeline enable signal ENS and the feedback signals FB1-FB3 to generate a plurality of index data strobe indexes IDX. The registers 2321-232N are triggered by one or both of the data strobe signal DQS and the inverted data strobe signal DQSF, and the registers 2321-232N and the multiplexer 231 form a shift register. A truth table of the multiplexer 231 can be shown as below:

| PINF1 | PINF2 | PINF3 | PINF4 | The output of the multiplexer |
|---|---|---|---|---|
| 1 | 0 | 0 | 0 | ENS |
| 0 | 1 | 0 | 0 | FB1 |
| 0 | 0 | 1 | 0 | FB2 |
| 0 | 0 | 0 | 1 | FB3 |

Figure 3:
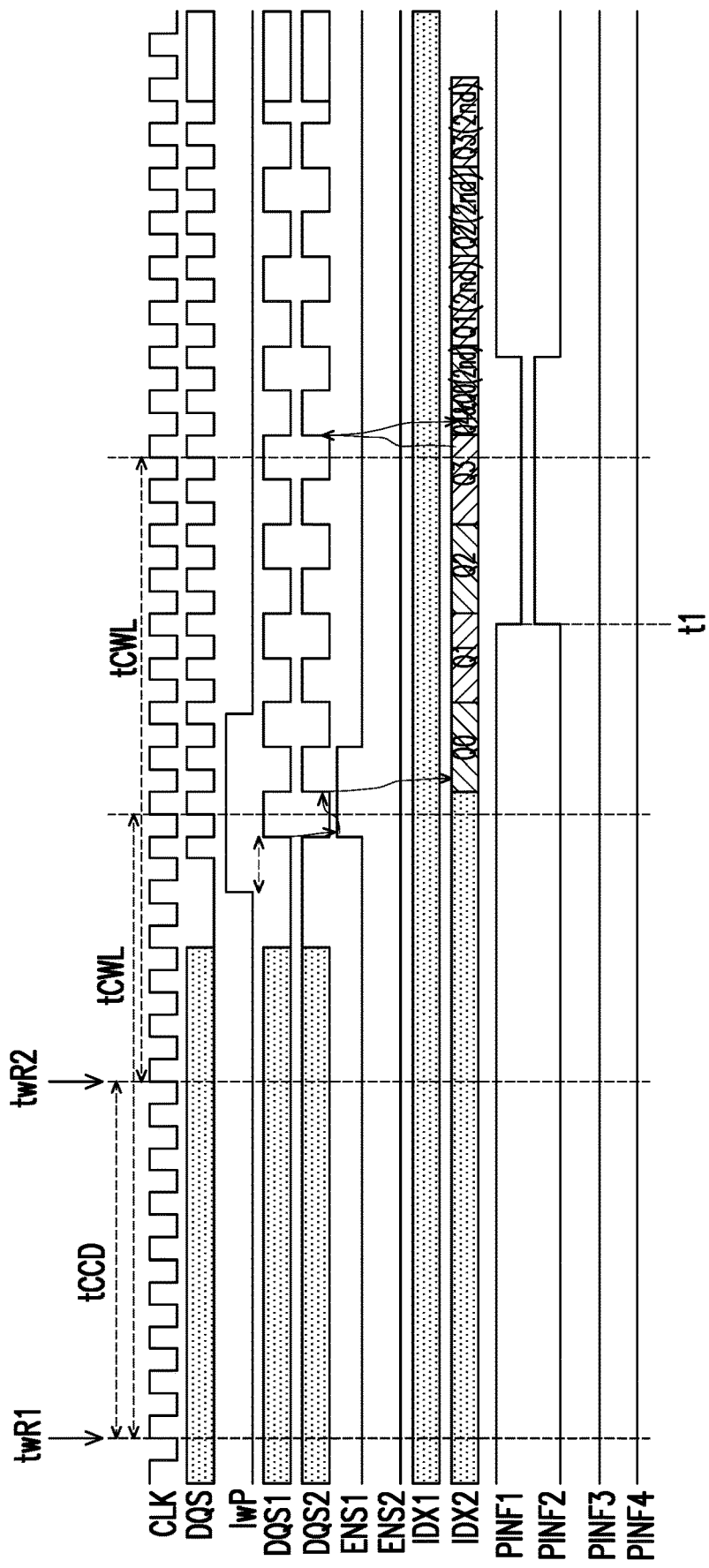
FIG. 3 to FIG. 9 illustrate a plurality of waveform plots of the data writing control device according to different embodiments of present disclosure.

Please refer to FIG. 2 and FIG. 3 to FIG. 9, wherein FIG. 3 to FIG. 9 illustrate a plurality of waveform plots of the data writing control device according to different embodiments of present disclosure. In FIG. 3, a first write command is received by the data writing control device 200 at a time point tWR1. A number of cycles tCCD that must be allowed to elapse between successive column commands is set to equal to 8 cycles of a clock signal CLK, and a second write command is received by the data writing control device 200 at a time point tWR2.

A data strobe signal DQS can be generated according to the clock signal CLK. Another data strobe signals DQS1 and DQS2 can be generated by dividing the clock signal CLK. The data strobe signals DQS1 and DQS2 have different phases. In present disclosure, the data strobe signals DQS1 is inverted to the data strobe signals DQS2.

An internal write pulse IWP can be generated by the internal write pulse generator 213 corresponding to the first write commend. After the internal write pulse IWP is enabled, the data strobe signals DQS1 and DQS2 can be generated. Furthermore, a latency time tCWL of a CAS writing latency can be set. A data strobe pipeline enable signal ENS1 can be generated by the data strobe enable signal generator 220 according to the time point tWR1 and the latency time tCWL. In here, the data strobe pipeline enable signal ENS1 is triggered by a positive edge of the data strobe signals DQS1 to be enabled, and the data strobe pipeline enable signal ENS1 is enabled when the internal write pulse IWP is enabled.

A data strobe index IDX2 can be generated by triggering by negative edges of the data strobe signal DQS2, and the data strobe index IDX2 with value Q1, Q2, Q3 and Q4 can be outputted in series. The data strobe index IDX2 with value Q1, Q2, Q3 and Q4 correspond to the first write command.

When the second write command is processed, the second write command is a current write command and the first write command is a previous write command. The control signal generator 210 can judge whether the second write command corresponding to a complete preamble or not to generate the preamble information. In this case, the preamble information has four bits PINF1-PINF4. Since the second write command corresponding to an incomplete preamble, the first bit of the preamble information PINF1 can be pulled to logic 0 at a time point t1. At the same time, the preamble toggle calculator 212 can generate the three bits of the preamble information PINF2-PINF4 according to a depth of the writing data. In this embodiment, the three bits of the preamble information PINF2-PINF4 may respectively be logic 1, logic 0, and logic 0.

Corresponding to the second write command, the data strobe index IDX2 with value Q0 (2nd), Q1 (2nd), Q2 (2nd) and Q3(2nd) can be generated after the value Q4. That is, the first write command and the second write command can be efficiency executed with seamless writing and the requirement of specification can be met.

In this embodiment, a data strobe pipeline enable signal ENS1 is kept at logic 0, and a data strobe index IDX1 may be kept on a floating state.

Figure 4:
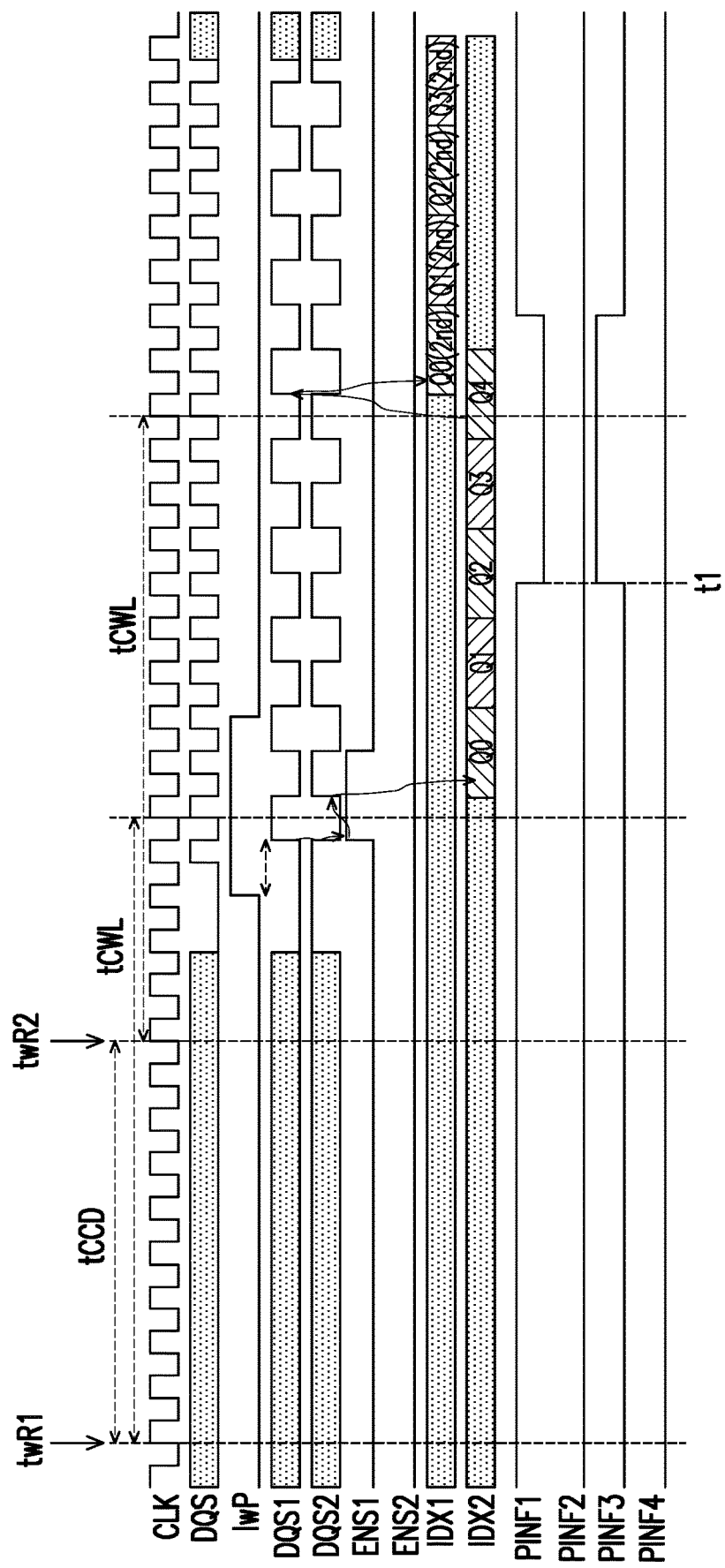

In FIG. 4, a first write command is received by the data writing control device 200 at a time point tWR1. A number of cycles tCCD that must be allowed to elapse between successive column commands is set to equal to 9 cycles of a clock signal CLK, and a second write command is received by the data writing control device 200 at a time point tWR2.

An internal write pulse IWP can be generated by the internal write pulse generator 213 corresponding to the first write commend. After the internal write pulse IWP is enabled, the data strobe signals DQS1 and DQS2 can be generated. Furthermore, a latency time tCWL of a CAS writing latency can be set. A data strobe pipeline enable signal ENS1 can be generated by the data strobe enable signal generator 220 according to the time point tWR1 and the latency time tCWL. In here, the data strobe pipeline enable signal ENS1 is triggered by a positive edge of the data strobe signals DQS1 to be enabled, and the data strobe pipeline enable signal ENS1 is enabled when the internal write pulse IWP is enabled.

A data strobe index IDX2 can be generated by triggering by negative edges of the data strobe signal DQS2, and the data strobe index IDX2 with value Q1, Q2, Q3 and Q4 can be outputted in series. The data strobe index IDX2 with value Q1, Q2, Q3 and Q4 correspond to the first write command.

When the second write command is processed, the second write command is a current write command and the first write command is a previous write command. The control signal generator 210 can judge whether the second write command corresponding to a complete preamble or not to generate the preamble information. In this case, the preamble information has four bits PINF1-PINF4. Since the second write command corresponding to an incomplete preamble, the first bit of the preamble information PINF1 can be pulled to logic 0 at a time point t1. At the same time, the preamble toggle calculator 212 can generate the three bits of the preamble information PINF2-PINF4 according to a depth of the writing data. In this embodiment, the three bits of the preamble information PINF2-PINF4 may respectively be logic 0, logic 1, and logic 0.

Corresponding to the second write command, a data strobe index IDX1 can be generated by triggering by negative edges of the data strobe signal DQS1, and the data strobe index IDX1 with value Q0 (2nd), Q1 (2nd), Q2 (2nd) and Q3(2nd) can be generated. That is, the second write command can be efficiency executed and the requirement of specification can be met.

In this embodiment, a data strobe pipeline enable signal ENS2 is kept at logic 0.

Figure 5:
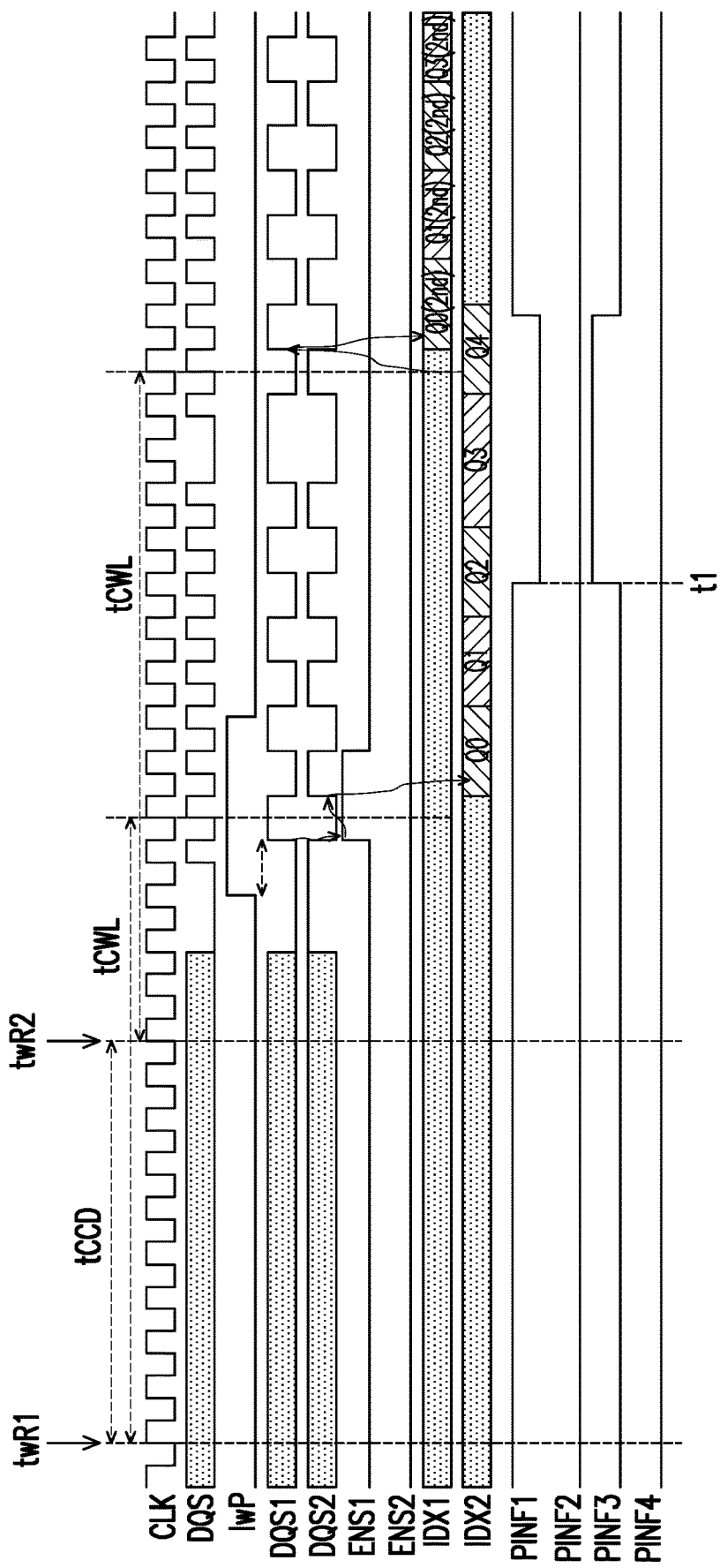

In FIG. 5, a first write command is received by the data writing control device 200 at a time point tWR1. A number of cycles tCCD that must be allowed to elapse between successive column commands is set to equal to 10 cycles of a clock signal CLK, and a second write command is received by the data writing control device 200 at a time point tWR2.

An internal write pulse IWP can be generated by the internal write pulse generator 213 corresponding to the first write commend. After the internal write pulse IWP is enabled, the data strobe signals DQS1 and DQS2 can be generated. Furthermore, a latency time tCWL of a CAS writing latency can be set. A data strobe pipeline enable signal ENS1 can be generated by the data strobe enable signal generator 220 according to the time point tWR1 and the latency time tCWL. In here, the data strobe pipeline enable signal ENS1 is triggered by a positive edge of the data strobe signals DQS1 to be enabled, and the data strobe pipeline enable signal ENS1 is enabled when the internal write pulse IWP is enabled.

A data strobe index IDX2 can be generated by triggering by negative edges of the data strobe signal DQS2, and the data strobe index IDX2 with value Q1, Q2, Q3 and Q4 can be outputted in series. The data strobe index IDX2 with value Q1, Q2, Q3, Q4 and Q5 correspond to the first write command.

When the second write command is processed, the second write command is a current write command and the first write command is a previous write command. The control signal generator 210 can judge whether the second write command corresponding to a complete preamble or not to generate the preamble information. In this case, the preamble information has four bits PINF1-PINF4. Since the second write command corresponding to an incomplete preamble, the first bit of the preamble information PINF1 can be pulled to logic 0 at a time point t1. At the same time, the preamble toggle calculator 212 can generate the three bits of the preamble information PINF2-PINF4 according to a depth of the writing data. In this embodiment, the three bits of the preamble information PINF2-PINF4 are respectively logic 0, logic 1, and logic 0.

Corresponding to the second write command, a data strobe index IDX1 can be generated by triggering by negative edges of the data strobe signal DQS1, and the data strobe index IDX1 with value Q0 (2nd), Q1 (2nd), Q2 (2nd) and Q3(2nd) can be generated. That is, the second write command can be efficiency executed and the requirement of specification can be met.

In this embodiment, a data strobe pipeline enable signal ENS2 is kept at logic 0.

Figure 6:
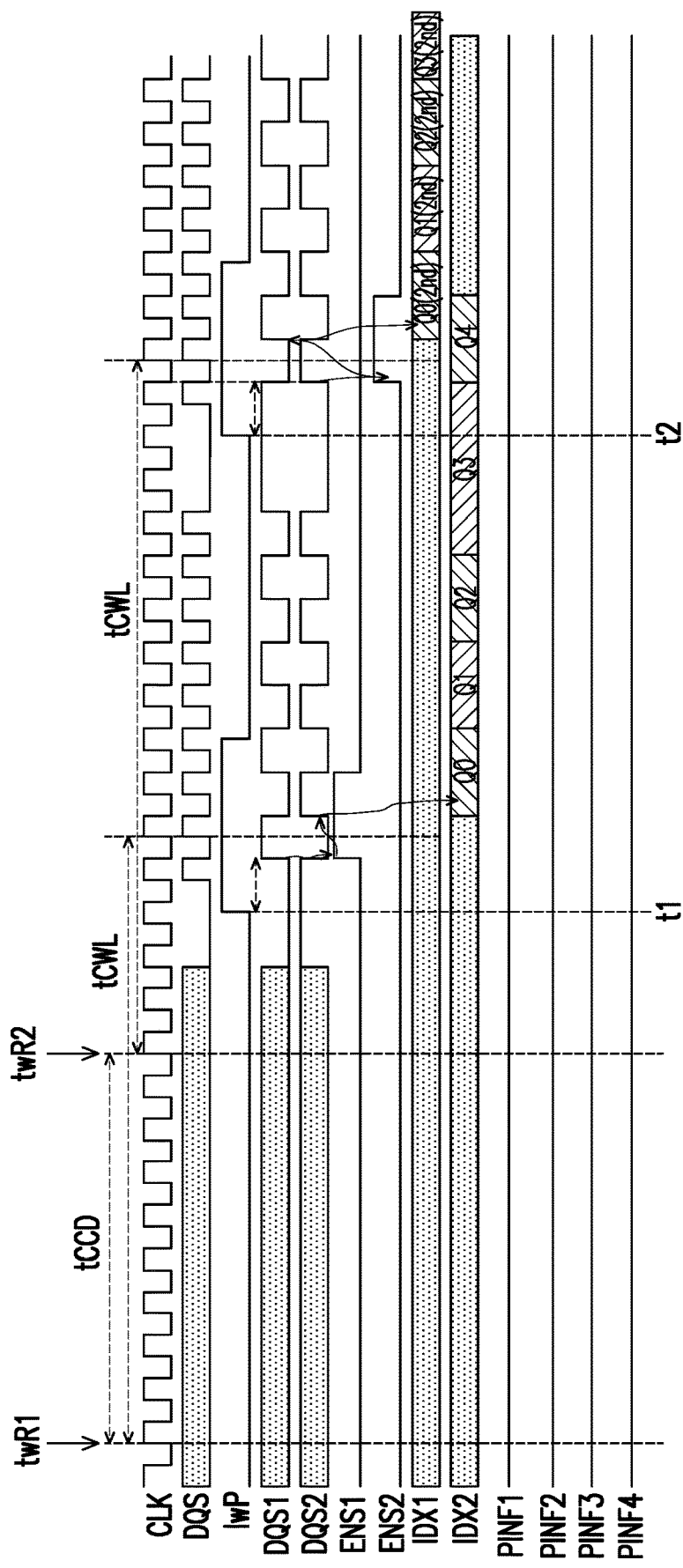

In FIG. 6, a first write command is received by the data writing control device 200 at a time point tWR1. A number of cycles tCCD that must be allowed to elapse between successive column commands is set to equal to 11 cycles of a clock signal CLK, and a second write command is received by the data writing control device 200 at a time point tWR2.

An internal write pulse IWP can be generated by the internal write pulse generator 213 corresponding to the first write commend. After the internal write pulse IWP is enabled, the data strobe signals DQS1 and DQS2 can be generated. A data strobe pipeline enable signal ENS1 can be generated by the data strobe enable signal generator 220 according to the time point tWR1 and the latency time tCWL. In here, the data strobe pipeline enable signal ENS1 is triggered by a positive edge of the data strobe signals DQS1 to be enabled at a time point t1, and the data strobe pipeline enable signal ENS1 is enabled when the internal write pulse IWP is firstly enabled. Furthermore, the internal write pulse IWP can be enabled again at a time point t2. The data strobe pipeline enable signal ENS2 is enabled when the internal write pulse IWP is enabled after the time point t2.

A data strobe index IDX2 can be generated by triggering by negative edges of the data strobe signal DQS2, and the data strobe index IDX2 with value Q1, Q2, Q3 and Q4 can be outputted in series. The data strobe index IDX2 with value Q1, Q2, Q3 and Q4 correspond to the first write command.

When the second write command is processed, the second write command is a current write command and the first write command is a previous write command. The control signal generator 210 can judge whether the second write command corresponding to a complete preamble or not to generate the preamble information. In this case, the preamble information has four bits PINF1-PINF4. Since the second write command corresponding to a complete preamble, the first bit of the preamble information PINF1 can be kept at logic 0. At the same time, the preamble toggle calculator 212 can keep the three bits of the preamble information PINF2-PINF4 to logic 0.

Corresponding to the second write command, a data strobe index IDX1 can be generated by triggering by negative edges of the data strobe signal DQS1, and the data strobe index IDX1 with value Q0 (2nd), Q1 (2nd), Q2 (2nd) and Q3(2nd) can be generated. That is, the second write command can be efficiency executed and the requirement of specification can be met.

Figure 7:
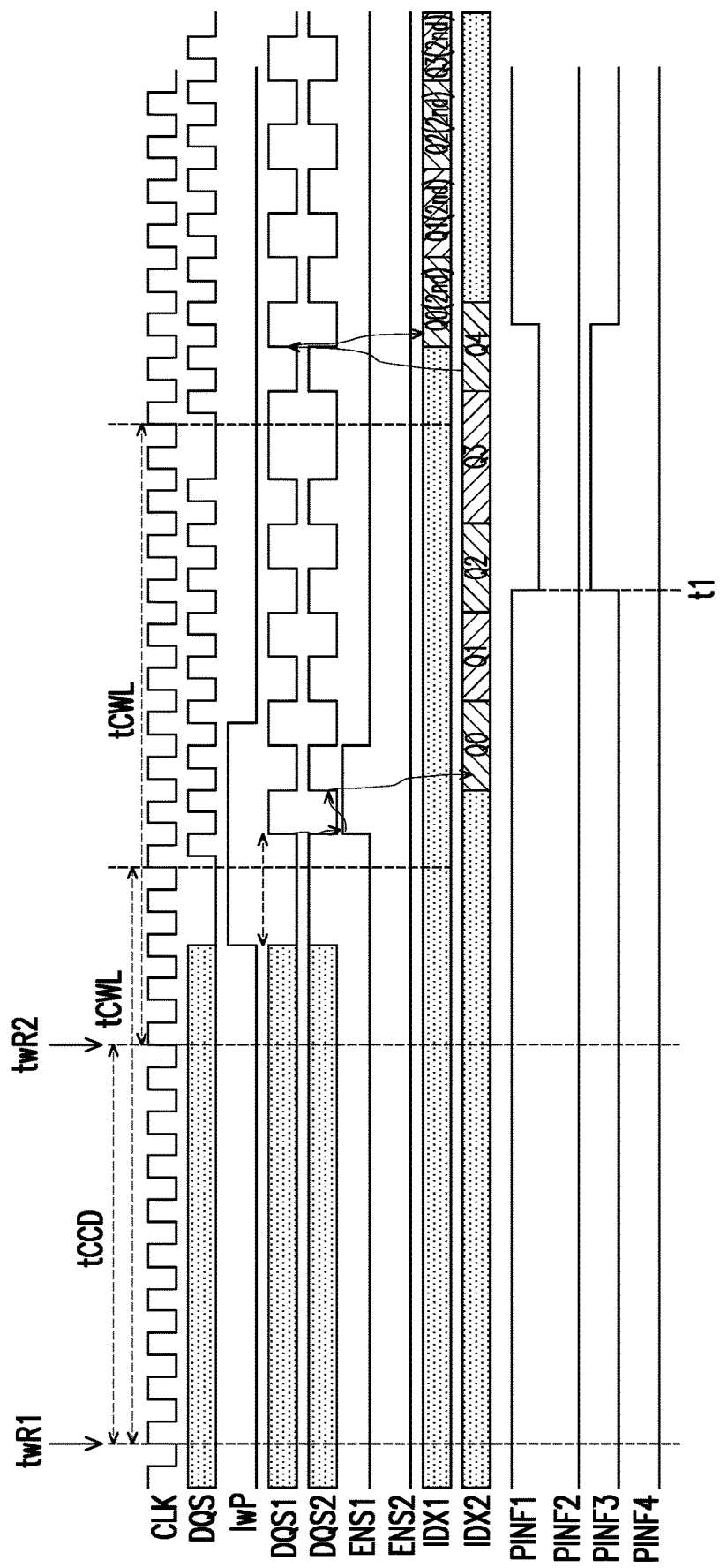

In FIG. 7, a first write command is received by the data writing control device 200 at a time point tWR1. A number of cycles tCCD that must be allowed to elapse between successive column commands is set to equal to 10 cycles of a clock signal CLK, and a second write command is received by the data writing control device 200 at a time point tWR2.

An internal write pulse IWP can be generated by the internal write pulse generator 213 corresponding to the first write commend. After the internal write pulse IWP is enabled, the data strobe signals DQS1 and DQS2 can be generated. Furthermore, a latency time tCWL of a CAS writing latency can be set. A data strobe pipeline enable signal ENS1 can be generated by the data strobe enable signal generator 220 according to the time point tWR1 and the latency time tCWL. In here, the data strobe pipeline enable signal ENS1 is triggered by a positive edge of the data strobe signals DQS1 to be enabled, and the data strobe pipeline enable signal ENS1 is enabled when the internal write pulse IWP is enabled.

A data strobe index IDX2 can be generated by triggering by negative edges of the data strobe signal DQS2, and the data strobe index IDX2 with value Q1, Q2, Q3 and Q4 can be outputted in series. The data strobe index IDX2 with value Q1, Q2, Q3 and Q4 correspond to the first write command.

When the second write command is processed, the second write command is a current write command and the first write command is a previous write command. The control signal generator 210 can judge whether the second write command corresponding to a complete preamble or not to generate the preamble information. Since the second write command corresponding to an incomplete preamble, the first bit of the preamble information PINF1 can be pulled to logic 0 at a time point t1. At the same time, the preamble toggle calculator 212 can generate the three bits of the preamble information PINF2-PINF4 according to a depth of the writing data. In this embodiment, the three bits of the preamble information PINF2-PINF4 are respectively logic 0, logic 1, and logic 0.

Corresponding to the second write command, a data strobe index IDX1 can be generated by triggering by negative edges of the data strobe signal DQS1, and the data strobe index IDX1 with value Q0 (2nd), Q1 (2nd), Q2 (2nd) and Q3(2nd) can be generated. That is, the second write command can be efficiency executed and the requirement of specification can be met.

In this embodiment, a data strobe pipeline enable signal ENS2 is kept at logic 0. The position of the data strobe signal DQS relative to the clock signal CLK (tDQSS) is set to a maximum value, and a delay between the clock signal CLK and the data strobe signal DQS (tDQSD) is set to maximum, too.

Figure 8:
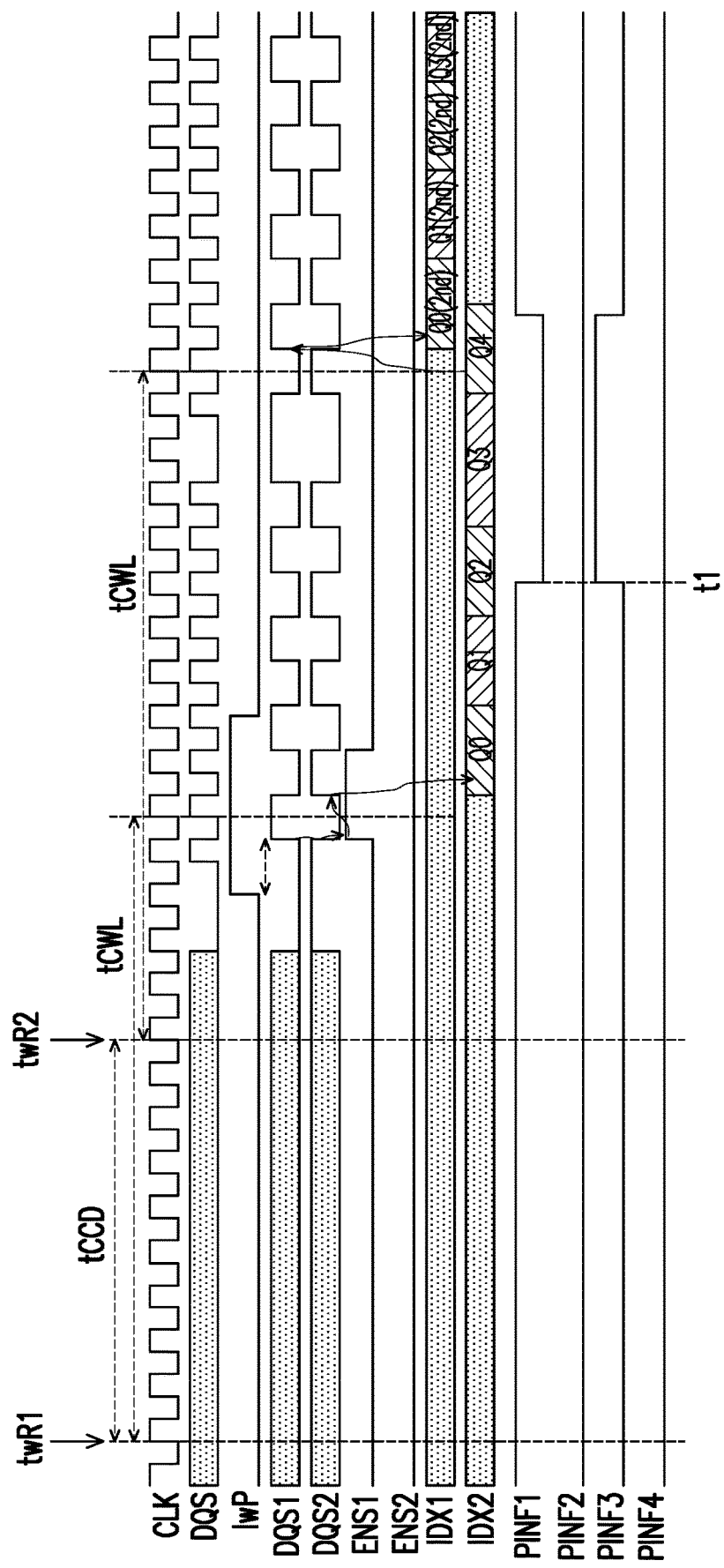

In FIG. 8, a first write command is received by the data writing control device 200 at a time point tWR1. A number of cycles tCCD that must be allowed to elapse between successive column commands is set to equal to 10 cycles of a clock signal CLK, and a second write command is received by the data writing control device 200 at a time point tWR2.

An internal write pulse IWP can be generated by the internal write pulse generator 213 corresponding to the first write commend. After the internal write pulse IWP is enabled, the data strobe signals DQS1 and DQS2 can be generated. Furthermore, a latency time tCWL of a CAS writing latency can be set. A data strobe pipeline enable signal ENS1 can be generated by the data strobe enable signal generator 220 according to the time point tWR1 and the latency time tCWL. In here, the data strobe pipeline enable signal ENS1 is triggered by a positive edge of the data strobe signals DQS1 to be enabled, and the data strobe pipeline enable signal ENS1 is enabled when the internal write pulse IWP is enabled.

A data strobe index IDX2 can be generated by triggering by negative edges of the data strobe signal DQS2, and the data strobe index IDX2 with value Q1, Q2, Q3 and Q4 can be outputted in series. The data strobe index IDX2 with value Q1, Q2, Q3 and Q4 correspond to the first write command.

When the second write command is processed, the second write command is a current write command and the first write command is a previous write command. The control signal generator 210 can judge whether the second write command corresponding to a complete preamble or not to generate the preamble information. Since the second write command corresponding to an incomplete preamble, the first bit of the preamble information PINF1 can be pulled to logic 0 at a time point t1. At the same time, the preamble toggle calculator 212 can generate the three bits of the preamble information PINF2-PINF4 according to a depth of the writing data. In this embodiment, the three bits of the preamble information PINF2-PINF4 are respectively logic 0, logic 1, and logic 0.

Corresponding to the second write command, a data strobe index IDX1 can be generated by triggering by negative edges of the data strobe signal DQS1, and the data strobe index IDX1 with value Q0 (2nd), Q1 (2nd), Q2 (2nd) and Q3(2nd) can be generated. That is, the second write command can be efficiency executed and the requirement of specification can be met.

In this embodiment, a data strobe pipeline enable signal ENS2 is kept at logic 0. The position of the data strobe signal DQS relative to the clock signal CLK (tDQSS) is set to 0, and a delay between the clock signal CLK and the data strobe signal DQS (tDQSD) is set to 0, too.

Figure 9:
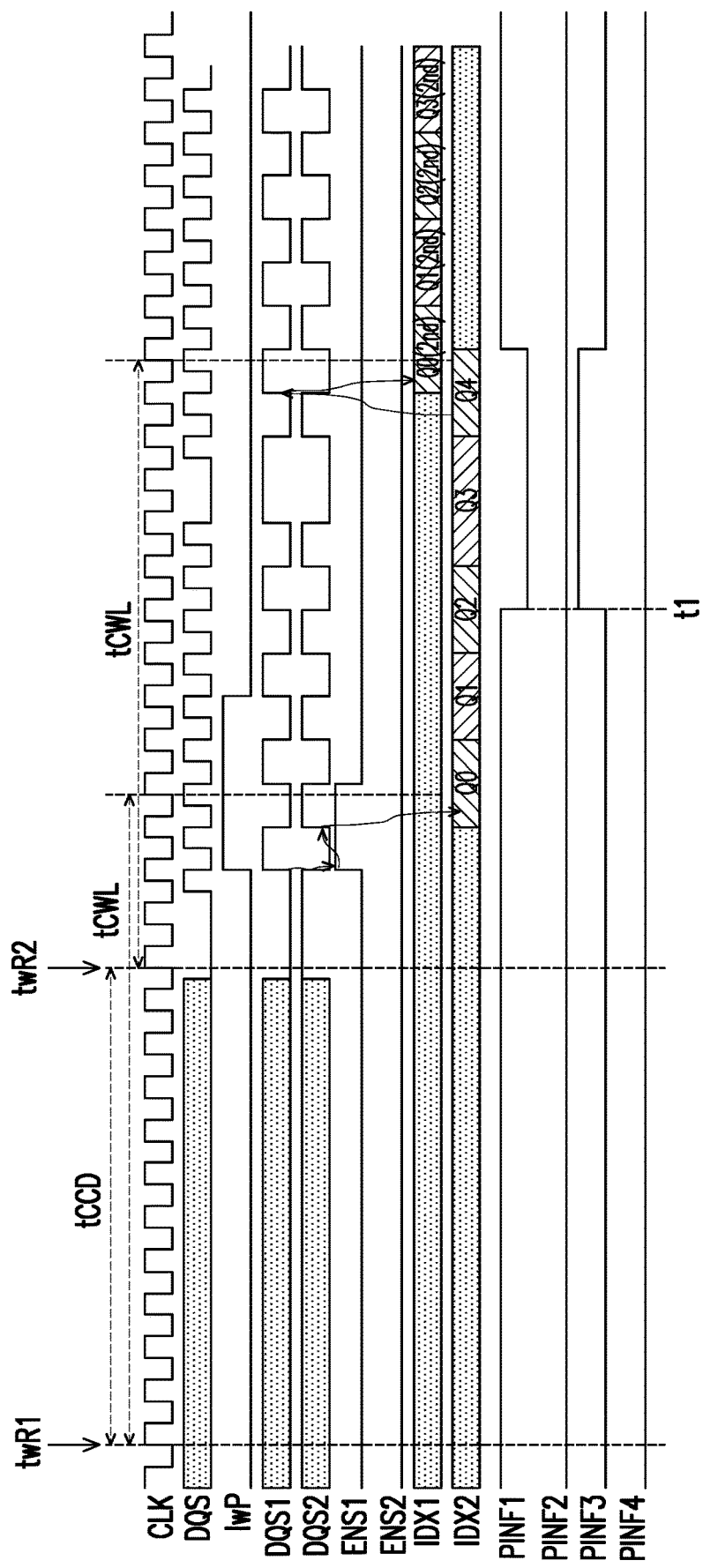

In FIG. 9, a first write command is received by the data writing control device 200 at a time point tWR1. A number of cycles tCCD that must be allowed to elapse between successive column commands is set to equal to 10 cycles of a clock signal CLK, and a second write command is received by the data writing control device 200 at a time point tWR2.

An internal write pulse IWP can be generated by the internal write pulse generator 213 corresponding to the first write commend. After the internal write pulse IWP is enabled, the data strobe signals DQS1 and DQS2 can be generated. Furthermore, a latency time tCWL of a CAS writing latency can be set. A data strobe pipeline enable signal ENS1 can be generated by the data strobe enable signal generator 220 according to the time point tWR1 and the latency time tCWL. In here, the data strobe pipeline enable signal ENS1 is triggered by a positive edge of the data strobe signals DQS1 to be enabled, and the data strobe pipeline enable signal ENS1 is enabled when the internal write pulse IWP is enabled.

A data strobe index IDX2 can be generated by triggering by negative edges of the data strobe signal DQS2, and the data strobe index IDX2 with value Q1, Q2, Q3 and Q4 can be outputted in series. The data strobe index IDX2 with value Q1, Q2, Q3 and Q4 correspond to the first write command.

When the second write command is processed, the second write command is a current write command and the first write command is a previous write command. The control signal generator 210 can judge whether the second write command corresponding to a complete preamble or not to generate the preamble information. Since the second write command corresponding to an incomplete preamble, the first bit of the preamble information PINF1 can be pulled to logic 0 at a time point t1. At the same time, the preamble toggle calculator 212 can generate the three bits of the preamble information PINF2-PINF4 according to a depth of the writing data. In this embodiment, the three bits of the preamble information PINF2-PINF4 are respectively logic 0, logic 1, and logic 0.

Corresponding to the second write command, a data strobe index IDX1 can be generated by triggering by negative edges of the data strobe signal DQS1, and the data strobe index IDX1 with value Q0 (2nd), Q1 (2nd), Q2 (2nd) and Q3(2nd) can be generated. That is, the second write command can be efficiency executed and the requirement of specification can be met.

In this embodiment, a data strobe pipeline enable signal ENS2 is kept at logic 0. A time difference of the data strobe signal DQS relative to the clock signal CLK (tDQSS) is set to a minimum value, and a time delay between the clock signal CLK and the data strobe signal DQS (tDQSD) is set to a minimum value, too.

Figure 10:
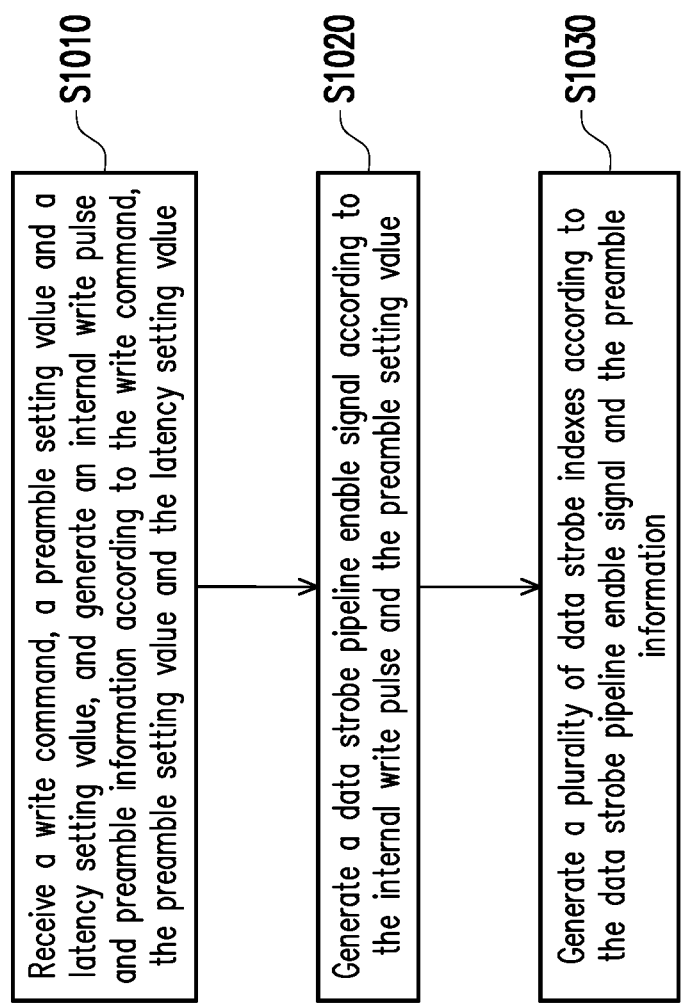
FIG. 10 illustrates a flow chart of a data writing control method according to an embodiment of present disclosure.

Please refer to FIG. 10, which illustrates a flow chart of a data writing control method according to an embodiment of present disclosure. A step S1010 is executed by receiving a write command, a preamble setting value and a latency setting value, and generating an internal write pulse and preamble information according to the write command, the preamble setting value and the latency setting value. A step S1020 is execute by generating a data strobe pipeline enable signal according to the internal write pulse and the preamble setting value. Then a step S1030 is executed by generating a plurality of data strobe indexes according to the data strobe pipeline enable signal and the preamble information.

Detail operations of the steps S1010-S1030 have been described in the embodiments mentioned above, and no more repeated discussion here.

In summary, the data writing control device of present disclosure provides the control signal generator to generate the preamble information according to whether a current write command corresponding to a complete preamble or not and a data depth of writing data. The data strobe index generator can generate the data strobe indexes according to the preamble information. Such as that, a specification of the memory device can be met, and the write command can be successfully executed correspondingly.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data writing control device, adapted for a memory device, comprising:
   a control signal generator, receiving a write command, a preamble setting value and a latency setting value, and generating an internal write pulse and preamble information according to the write command, the preamble setting value and the latency setting value;
   a data strobe enable signal generator, coupled to the control signal generator and generating a data strobe pipeline enable signal according to the internal write pulse and the preamble setting value; and
   a data strobe index generator, coupled to the data strobe enable signal generator, and generating a plurality of data strobe indexes according to the data strobe pipeline enable signal and the preamble information.

2. The data writing control device according to claim 1, wherein the control signal generator comprises:
   a write gap calculator, wherein when a current write command corresponds to an incomplete preamble, the write gap calculator calculates a start time point of the current write command according a gap and a start time point of a previous write command;
   a preamble toggle calculator, generates the preamble information according to whether the current write command corresponding to a complete preamble or not and a data depth of writing data; and
   an internal write pulse generator, generates the internal write pulse according the write command, the preamble information and the latency setting value.

3. The data writing control device according to claim 2, wherein the preamble information comprises a full_preamble flag and a preamble toggle signal, where the full_preamble flag is used to indicate whether the current write command corresponding to the complete preamble or not, and the preamble toggle signal with at least one bit corresponds to the data depth of the writing data.

4. The data writing control device according to claim 3, wherein the data strobe index generator comprises:
   a multiplexer, coupled to the data strobe enable signal generator and the preamble toggle calculator, selecting one of the internal write pulse and a plurality of feedback signals to generate the data strobe indexes according to the preamble information; and
   a plurality of registers, coupled to an output end of the multiplexer in series, and shifts a signal on the output end of the multiplexer according to a data strobe signal, wherein a plurality of selected registers of the registers generate the feedback signals, respectively.

5. The data writing control device according to claim 4, wherein number of the registers correspond to the data depth of the writing data.

6. The data writing control device according to claim 4, wherein the registers are triggered according to both of the data strobe signal and an inverted data strobe signal.

7. The data writing control device according to claim 1, wherein the control signal generator further comprising:
an internal writing pulse generator, generates the internal writing pulse according to the write command.

8. The data writing control device according to claim 1, wherein the control signal generator further comprises:
a write command receiving interface being configured to receive the write command, the preamble setting value and the latency setting value.

9. A data writing control method, adapted for a memory device, comprising:
receiving a write command, a preamble setting value and a latency setting value, and generating an internal write pulse and preamble information according to the write command, the preamble setting value and the latency setting value;
generating a data strobe pipeline enable signal according to the internal write pulse and the preamble setting value; and
generating a plurality of data strobe indexes according to the data strobe pipeline enable signal and the preamble information.

10. The data writing control method according to claim 9, further comprising:
calculating a start time point of the current write command according a gap and a start time point of a previous write command when a current write command corresponds to an incomplete preamble; and
generating the preamble information according to whether the current write command corresponding to a complete preamble or not and a data depth of writing data.

11. The data writing control method according to claim 9, further comprising:
selecting one of the internal write pulse and a plurality of feedback signals to generate the data strobe indexes according to the preamble information;
shifting the data strobe indexes according to a data strobe signal by a plurality of registers; and
generating the feedback signals by a plurality of selected registers of the registers.

12. The data writing control method according to claim 11, wherein shifting the data strobe indexes according to the data strobe signal comprises:
shifting the data strobe indexes by both of the data strobe signal and an inverted data strobe signal.

* * * * *